United States Patent

Bazylenko

(10) Patent No.: US 6,528,338 B2
(45) Date of Patent: Mar. 4, 2003

(54) SILICA-BASED OPTICAL DEVICE FABRICATION

(75) Inventor: Michael Bazylenko, Eveleigh (AU)

(73) Assignee: Redfern Integrated Optics Pty LTD, Eveleigh (AU)

(*) Notice: Subject to any disclaimer, the term of this patent is extended or adjusted under 35 U.S.C. 154(b) by 0 days.

(21) Appl. No.: 09/915,144

(22) Filed: Jul. 25, 2001

(65) Prior Publication Data

US 2002/0132386 A1 Sep. 19, 2002

Related U.S. Application Data

(60) Provisional application No. 60/290,374, filed on May 11, 2001.

(30) Foreign Application Priority Data

Mar. 13, 2001 (AU) ............................................. PR3682

(51) Int. Cl.⁷ ............................................... H01L 21/00
(52) U.S. Cl. ........................................... 438/31; 438/29
(58) Field of Search ............................... 438/31, 29, 22

(56) References Cited

U.S. PATENT DOCUMENTS

| 5,279,865 A | * | 1/1994 | Chebi et al. ................. 427/571 |
| 5,483,613 A | | 1/1996 | Bruce et al. |
| 5,732,179 A | * | 3/1998 | Caneau et al. .............. 385/131 |
| 5,827,342 A | | 10/1998 | Beguin et al. |
| 5,904,491 A | * | 5/1999 | Ojha et al. .................... 438/31 |
| 5,930,439 A | * | 7/1999 | Ojha et al. .................. 385/129 |
| 6,177,290 B1 | * | 1/2001 | Jang et al. .................... 438/31 |
| 6,184,158 B1 | * | 2/2001 | Shufflebotham et al. ..................... 204/192.23 |
| 6,379,873 B1 | | 4/2002 | Bazylenko et al. |
| 6,477,308 B2 | * | 11/2002 | Hattori et al. ............... 385/129 |
| 2001/0024559 A1 | * | 9/2001 | Kling .......................... 385/132 |
| 2002/0022564 A1 | * | 2/2002 | Minamikawa et al. ......... 501/4 |
| 2002/0154878 A1 | * | 10/2002 | Akwai et al. ................ 385/129 |

FOREIGN PATENT DOCUMENTS

WO 9220833 11/1992

OTHER PUBLICATIONS

Richard C. Jaeger, Introduction To Microelectronic Fabrication, Reprinted May 1993, Addisopn–Wesley Publishing Company, vol. V, pp. 14 and 15.*

* cited by examiner

Primary Examiner—Carl Whitehead, Jr.
Assistant Examiner—William Vesperman
(74) Attorney, Agent, or Firm—Ladas & Parry

(57) ABSTRACT

The present invention provides a method of manufacturing a polarization-insensitive waveguide structure. The method comprises: depositing a buffer layer on a substrate; depositing a core layer on the buffer layer and etching the core layer so as to form a waveguide core; and depositing a silica-based cladding layer over the core by means of plasma-enhanced chemical vapor deposition (PECVD) in the absence of nitrogen or nitrogen-containing gases so as to complete the waveguide structure, wherein the cladding layer is deposited in a manner which substantially prevents polarization sensitivity in the waveguide structure. The cladding layer can be deposited with an intrinsic stress which cancels out any thermal stresses. The stress can be controlled by controlling the PECVD deposition conditions, such as power and ion bombardment.

26 Claims, 5 Drawing Sheets

SILICA-BASED OPTICAL DEVICE FABRICATION

This application claims the benefit of provisional application No. 60/290,374, filed May 11, 2001.

TECHNICAL FIELD

The present invention relates to planar optical waveguides and in particular, to a method of fabricating a silica-based planar optical waveguide.

BACKGROUND OF THE INVENTION

The formation of optical waveguides is well known. Turning initially to FIG. 1, there is illustrated a sectional view of a planar channel waveguide structure 1 fabricated in accordance with prior art methods. The waveguide structure 1 comprises a silicon substrate 2 on which is deposited a silica buffer layer 3 followed by a silica-based core 4 and a subsequent silica cladding layer 5. A number of problems exist with prior art methods of fabricating this type of waveguide. In particular, prior art methods of depositing the various layers 3–5 on the substrate 2 can lead to the formation of thermal stresses due to differences between the thermal expansion coefficients of the substrate and the layers, which can in turn cause undesirable birefringence in one or more of the layers 3–5. If one or more of the layers 3–5 are sufficiently birefringent that a refractive index of an optical mode being guided in the waveguide structure 1 is affected by the polarisation of the mode, the waveguide is referred as being "polarisation sensitive". It is generally undesirable to produce waveguides which are polarisation sensitive because optical signals of different polarisations will not be processed identically. For example, a waveguide containing a Bragg grating which is polarisation sensitive can have a Bragg wavelength $\lambda_B$ for TE-polarised light which is different to the Bragg wavelength of TM-polarised light.

Prior art methods of preventing waveguide birefringence include modifying the composition of the cladding layer 5 so as to match the coefficient of thermal expansion of the silicon substrate 2. This can be done through co-doping the silica cladding layer 5 with phosphorous and boron. However, these co-dopants often make the cladding layer susceptible to moisture penetration.

Other prior art methods of preventing waveguide birefringence include using: stress-relieving grooves in the silica cladding; polarisation-rotating polymer plates; or UV trimming. Each of these techniques has the disadvantage of complicating the fabrication process.

SUMMARY OF THE INVENTION

In accordance with a first aspect of the present invention, there is provided a method of manufacturing a waveguide structure which is substantially polarisation-insensitive, the method comprising:

(a) depositing a buffer layer on a substrate;
(b) depositing a core layer on the buffer layer and etching the core layer so as to form a waveguide core; and
(c) depositing a silica-based cladding layer over the core by means of plasma-enhanced chemical vapour deposition (PECVD) in the absence of nitrogen or nitrogen-containing gases so as to complete the waveguide structure, wherein the cladding layer is deposited in a manner which substantially prevents polarisation sensitivity in the waveguide structure.

Preferably, the step of depositing the cladding layer does not include an annealing step. The cladding layer may be deposited in a manner which makes it unnecessary to subsequently anneal or reflow the cladding layer. For example, post-deposition annealing or reflowing is normally used in prior art fabrication methods to reduce optical losses and to fill in gaps in the cladding layer. In the present invention, the cladding layer is preferably deposited with an optical transparency and surface coverage sufficient to make annealing unnecessary. Such an embodiment is particularly advantageous since annealing and reflowing can introduce polarisation sensitivity such a sensitivity was not previously present.

Preferably, the PECVD is carried out using deposition conditions selected such that any stresses induced by the cladding layer are distributed in a manner which substantially prevents polarisation sensitivity in the waveguide. The PECVD may be carried out using deposition conditions selected to induce an intrinsic stress in the waveguide structure which at least partially negates any thermal stress in the waveguide so as to substantially prevent polarisation sensitivity in the waveguide. Thermal stress will be understood to mean stress which arises as a result of a difference between thermal expansion coefficients of the cladding layer and substrate. Intrinsic stress will be understood to mean stress in the cladding layer which is not attributable to thermal stress.

Alternatively or in addition, the PECVD may be carried out using deposition conditions selected to induce a degree of stress in the core sufficient to substantially compensate for any form birefringence resulting from a geometry of the core.

The selected PECVD deposition conditions may provide a degree of ion bombardment and/or a deposition rate required to form the cladding layer in a manner which substantially prevents polarisation sensitivity in the waveguide structure. The required degree of ion bombardment may be provided by controlling one or more of the following parameters:

a frequency of RF power applied across electrodes used in the PECVD;
a level of RF power applied across the electrodes; and
a processing pressure during the PECVD.

The PECVD may be carried out using two RF power sources to input RF power into electrodes used in the PECVD, wherein the two sources operate at a lower frequency and an upper frequency respectively. In this case, the required degree of ion bombardment may be provided by controlling one or more of the following parameters:

a level of RF power applied across the electrodes by the lower frequency power supply;
a level of RF power applied across the electrodes by the upper frequency power supply;
an operating frequency of the upper and/or lower frequency power supplies; and
a processing pressure used during the PECVD deposition.

The required deposition rate may be controlled by controlling one or more of the following parameters:

a flow rate of a vapour-phase precursor used in the PECVD;
a process pressure during the PECVD; and
a substrate temperature during the deposition.

In one embodiment, cladding-layer-induced stresses are controlled by simultaneously or individually controlling ion bombardment, deposition rate, or substrate temperature during the cladding layer deposition.

A liquid source material may be used to form the cladding layer. For example, the liquid source material may comprise tetraethoxysilane (TEOS). The method may further include introducing refractive-index-modifying dopants into the cladding layer to compensate for any refractive index differences between the cladding layer and the buffer layer. Examples of refractive-index-modifying dopants include refractive-index-decreasing dopants such as fluorine and boron, and refractive-index-increasing dopants such as germanium and phosphorus. Examples of source materials for refractive-index-modifying dopants include tetra-methyl germanium (TMG), tri-ethyl phosphate (TEPO) and tri-ethyl borate (TEB).

The step of depositing the cladding layer may comprise depositing two or more sub-layers in which at least one sub-layer is deposited in a manner which substantially prevents polarisation sensitivity in the waveguide structure. This embodiment has the advantage that the remaining sub-layers can optionally be deposited at a higher deposition rate than the at least one sub-layer so as to optimise fabrication time. The method may further include depositing the plurality of sub-layers such that at least one sub-layer is under a degree of tensile stress and at least one sub-layer is under a degree of compressive stress, wherein the sub-layers are arranged such that the net stress in the cladding layer substantially prevents polarisation sensitivity. In one embodiment, the tensile and compressive stresses substantially cancel each other out such that the net stress in the cladding layer is substantially zero. The stress in each sub-layer may be made more tensile (less compressive) by increasing the deposition rate. Also, the stress in each sub-layer may be made more tensile stress by decreasing the average ion bombardment energy. Thus, in general, the stress in each sub-layer can be made more tensile (less compressive) by increasing the ratio of deposition rate to average ion bombardment energy.

In accordance with a second aspect of the present invention, there is provided a method of manufacturing a waveguide structure which is substantially polarisation-insensitive, the method comprising:

(a) depositing a buffer layer on a substrate;

(b) depositing a core layer on the buffer layer and etching the core layer so as to form a waveguide core; and (c) depositing a silica-based cladding layer over the core, the cladding layer being formed by:

(i) depositing an initial silica-based layer over the core by means of plasma-enhanced chemical vapour deposition (PECVD) in the absence of nitrogen or nitrogen-containing gases; and (ii) subsequently annealing the initial silica-based layer so as to form the cladding layer, wherein the annealing and the PECVD are carried in a manner which substantially prevents polarisation sensitivity in the waveguide structure, and the annealing is carried out at a temperature which is higher than a deposition temperature during the PECVD but sufficiently low to substantially avoid reflowing of the initial silica-based layer Preferably, the PECVD and annealing are carried out under conditions selected such that any stresses induced by the cladding layer are distributed in a manner which substantially prevents polarisation sensitivity in the waveguide. This aspect of the invention has applications where other fabrication considerations make it necessary to subject the waveguide structure to an annealing process For example, if the waveguide structure is monolithically integrated on a common substrate with another optical component which requires annealing, it can be necessary to expose the waveguide structure to the same annealing conditions. Prior art waveguide structures have the disadvantage that they can be rendered polarisation sensitive as a result of annealing-induced thermal stresses. In the present invention, the cladding layer is deposited such that subsequent annealing substantially eliminates any polarisation sensitivity. In one embodiment, the PECVD and annealing are carried out using conditions selected such that the initial silica-based layer undergoes an increase in density during the annealing, wherein the increase in density is sufficient to at least partly counteract any thermal and/or intrinsic stress in the initial silica-based layer. The increase in density may cause a slight film shrinkage which at least partly relieves compressive stress in the waveguide structure. Such an embodiment has the advantage that the minimum annealing temperature required to alleviate stress in a low-density silica-based layer by densification can be lower than the temperature required to cause the layer to reflow. The stress counteracted during the annealing my comprise compressive stress. Preferably, the stress relief which occurs during the annealing is of a sufficient magnitude to substantially prevent polarisation sensitivity in the waveguide structure.

In accordance with a third aspect of the present invention, there is provided a waveguide structure fabricated in accordance with any one of the above-described methods.

It is to be understood that, if any prior art publication is referred to herein, such reference does not constitute an admission that the publication forms a part of the common general knowledge in the art, in Australia or any other country.

For the purposes of this specification it is to be clearly understood that the word "comprising" means "including but not limited to", and that the word "comprises" has a corresponding meaning.

BRIEF DESCRIPTION OF THE DRAWINGS

Embodiments of invention will now be described, by way of example only, with reference to accompanying drawings.

DETAILED DESCRIPTION OF THE DRAWINGS

Figure 2:
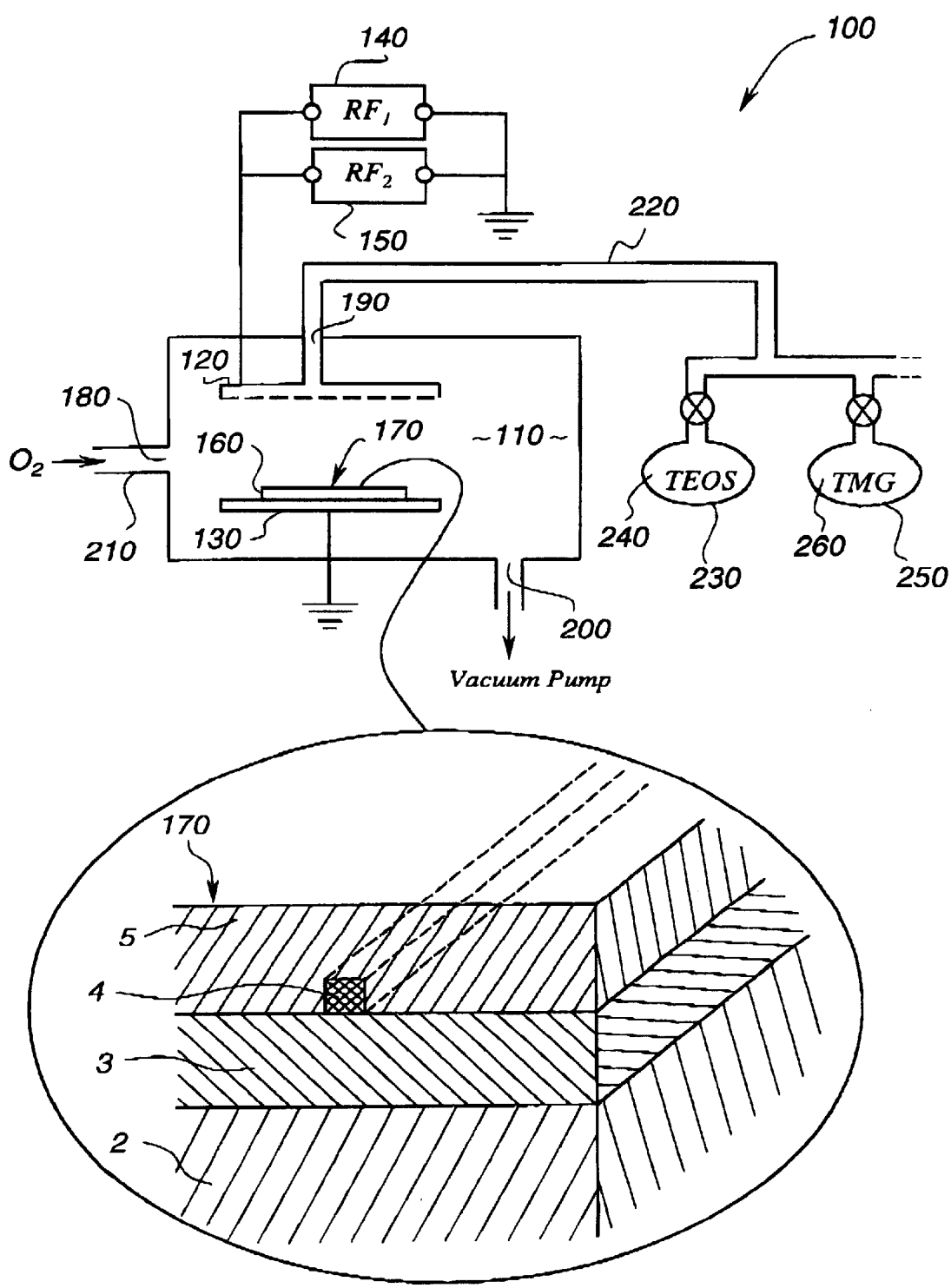
FIG. 2 schematically illustrates an embodiment of a PECVD system for depositing a cladding layer in accordance with the present invention.

With reference to FIG. 2, a PECVD system 100 for depositing silica-based waveguide structures includes an evacuated deposition chamber 110 containing opposing upper and lower electrodes 120, 130. A radio frequency (RF) power supply, comprising two RF power supplies 140, 150 connected in parallel, is used to apply RF power across the electrodes 120, 130. A substrate 160 is placed on the lower electrode 130 facing the upper electrode 120 so as to expose an upper surface 170 of the substrate to an RF plasma discharge generated between the electrodes and thereby deposit a film on the upper surface. The two RF power supplies comprise a first RF power supply 140 which operates at a frequency of 13.56 MHz and a second, lower frequency power supply 150 which in this embodiment operates at 450 kHz. Although the substrate 160 is heated during the deposition, the substrate heating apparatus is not shown here for simplicity. Also, a person skilled in the art will understand that the RF circuitry is shown in FIG. 2 in a simplified form. For example, an impedance matching circuit would normally be used with each power supply but is not illustrated here for simplicity. Any one of a number of commercially-available RF power supplies may be used in the present invention. The RF power supplies 140, 150 can be connected in a number of different ways without departing from the present invention.

The chamber 110 includes a gas inlet port 180 for introducing oxygen into the chamber, and a vapour inlet port 190 for introducing vapour-phase precursors into the chamber. The chamber 110 further includes a pumping port 200 connected to a vacuum pump (not shown) for evacuating the chamber. Oxygen is delivered to the gas inlet port 180 via a gas feed line 210. Vapour-phase precursors are delivered to the vapour inlet port 190 via a feed line 220 connected to a first vessel 230 containing a first liquid-phase precursor 240, and a second vessel 250 containing a second liquid-phase precursor 260. It will be appreciated that provisions for valves are made in both feed lines 210 and 220, but these are not shown in FIG. 2 for simplicity. In this embodiment, the first liquid-phase precursor 240 comprises liquid tetraethoxysilane (TEOS) and the second liquid-phase precursor 260 comprises tetramethylgermanium (TMG). TEOS is a precursor used to form silicon dioxide films and TMG is a precursor used for doping silicon dioxide with germanium dioxide when forming the core of a waveguide. However, it will be understood that precursors other than TEOS and TMG can be used to form silicon dioxide and germanium dioxide. When other core dopants are required in addition to germanium dioxide, additional vessels can be used to supply appropriate precursors to the chamber 110. For example, additional dopants such as fluorine, boron, germanium and/or phosphorus may be introduced into the core 4 in order match the refractive index of the cladding layer 5 to that of the buffer layer 3. Alternatively, the core 4 can be doped with materials other than germanium dioxide, such as $P_2O_3$, and a person skilled in the art will understand that such dopants can be formed by substituting TMG with an appropriate precursor source material.

It will be understood that FIG. 2 serves to illustrate the general principles of PECVD relevant to the present invention. Reference is hereby made to Australian provisional patent application number PR1782 by Redfern Integrated Optics Pty Ltd for further information about PECVD. It will also be understood that the PECVD system shown in FIG. 2 is merely one example of a deposition system suitable for implementing the present invention. Numerous modifications may be made to the deposition system without departing from the spirit or scope of the invention.

Figure 1:
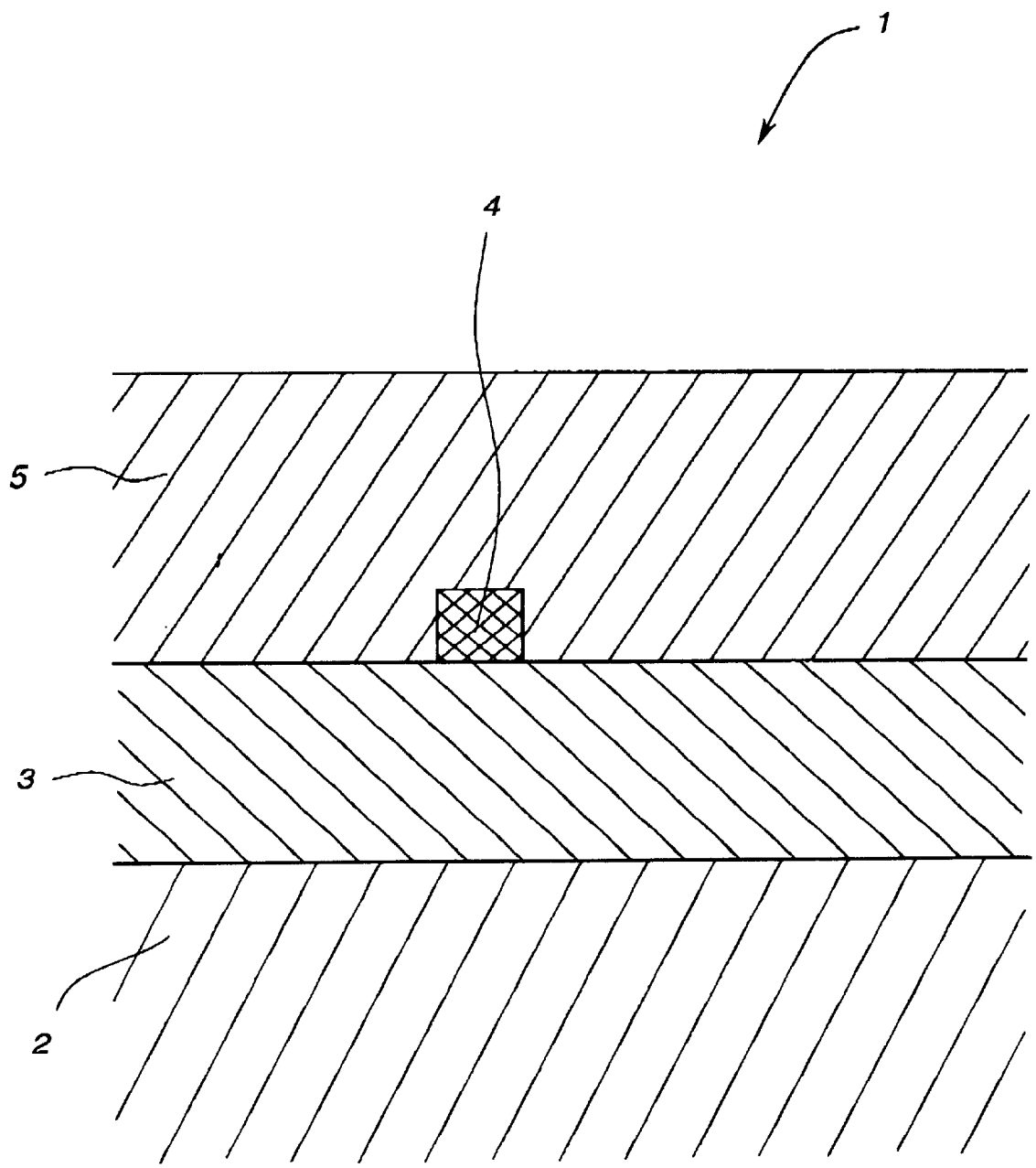
FIG. 1 illustrates a sectional view of a channel waveguide structure fabricated in accordance with prior art methods.
Figure 3:
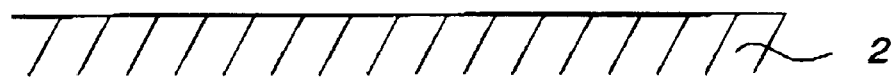
FIGS. 3 to 6 illustrate a series of steps involved in fabricating an optical waveguide in accordance with a first embodiment of the present invention.
Figure 4:
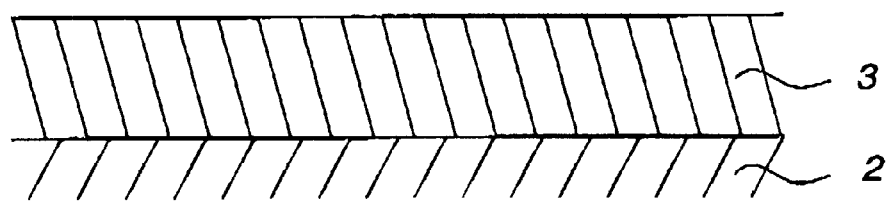

A method of fabricating the type of waveguide structure shown in FIG. 1 will now be described with reference to FIGS. 3 to 6. Initially, a substrate 2 in the form of a silicon wafer is provided as shown in FIG. 3. Subsequently, as shown in FIG. 4, a silicon dioxide buffer layer 3 is grown on the wafer 2. In this embodiment, the buffer layer 3 is grown by thermal oxidation. The buffer layer 3 in this example has a thickness of 10 $\mu$m, which is sufficient to optically separate subsequent layers from the substrate. However, it will be understood that the precise buffer layer thickness is not critical to the operation of the device and can be anywhere in the range from about 2 $\mu$m to about 20 $\mu$m. Although not shown in the Figures, the buffer layer can alternatively comprise an underlayer of thermally-oxidised silica and an overlayer of silica deposited by PECVD, so as to better match the buffer layer refractive index to the cladding layer refractive index. For example, the buffer layer can have an overall thickness of about 14 $\mu$m, comprising a 7 $\mu$m-thick underlayer of thermally-grown silica and a 7 $\mu$m-thick overlayer of silica deposited by PECVD.

Figure 5:
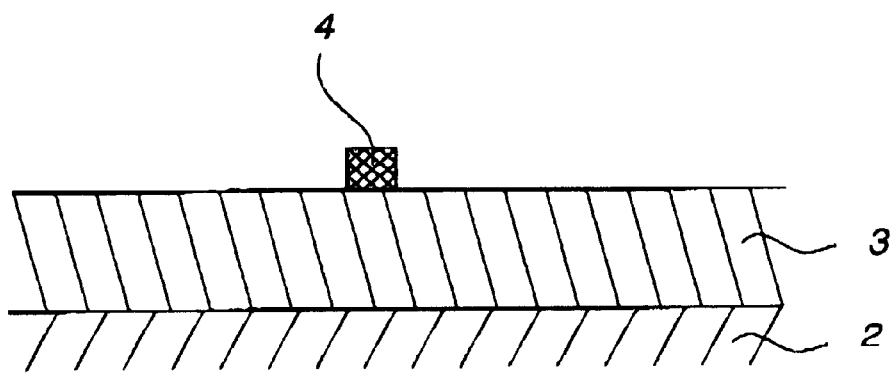
Figure 6:
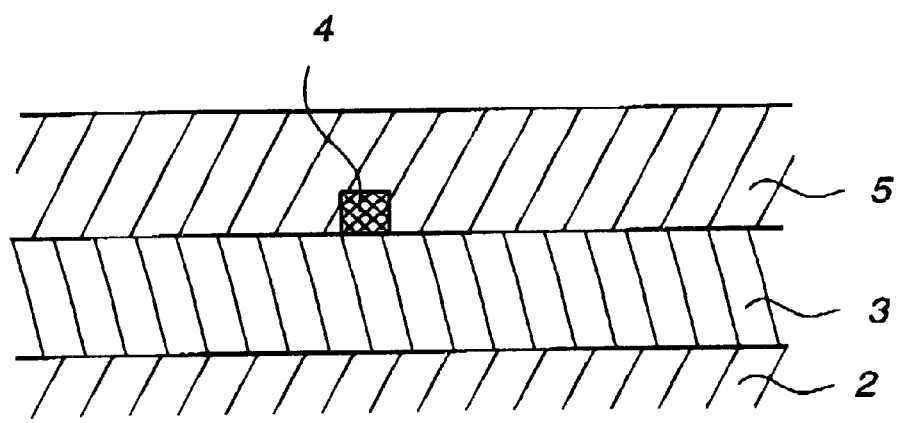

With reference to FIG. 5, a 6 $\mu$m-thick doped silica core 4 having a channel geometry is then formed on the buffer layer 3. The core 4 is formed by first depositing a uniform 6 $\mu$m film of germanium-doped silica (typical doping level about 10 mol %) over the buffer layer 3 using the PECVD system shown in FIG. 2. Such a film of germanium-doped silica is formed from a mixture of TEOS and TMG. Subsequently, the germanium-doped silica film is partially etched away using a masking and etching procedure, leaving the core 4 shown in FIG. 5. The core 4 can be in the form of a strip and is shaped using known photolithographic etching techniques.

Finally (see FIG. 6), a silica cladding layer 5, having a thickness of about 15–20 $\mu$m, is deposited over the core 4 and buffer layer 3 using the PECVD system shown in FIG. 2. PECVD has the advantage that it allows silica-based materials to be deposited at relatively low temperatures, which reduces the magnitude of resultant thermal stresses. The cladding layer 5 is deposited such that the waveguide structure 1 is substantially polarization insensitive. Methods of achieving such a cladding layer will now be discussed.

In a first embodiment, the cladding layer 5 is deposited with a degree of intrinsic stress which is of a sign and magnitude sufficient to either negate at least part of any thermal stress between the cladding layer 5 and the substrate 2, or to compensate for form birefringence in the core 4 (form birefringence is a polarisation sensitivity which arises from the dimensions and geometry of the core). For example, where the PECVD procedure results in a compressive thermal stress, the deposition conditions of the PECVD can be tailored to produce a tensile intrinsic stress in the cladding layer 5 which is sufficient to cancel out the thermal stress. The intrinsic stress can be controlled by controlling the degree of ion bombardment at the upper surface 170 of the substrate and the deposition rate of silica on the upper surface. In general, the level of tensile intrinsic stress in the cladding layer increases as the average ion bombardment energy (E) decreases. Conversely, the level of compressive intrinsic stress in the cladding layer generally increases as the average ion bombardment energy increases. Thus, by selecting the appropriate deposition conditions which cancel out the thermal stress, a cladding layer can be deposited which is substantially free of stress. Alternatively, by using the appropriate deposition conditions, the cladding layer can be given a level of stress which compensates for any form birefringence in the core 4.

Figure 7A:
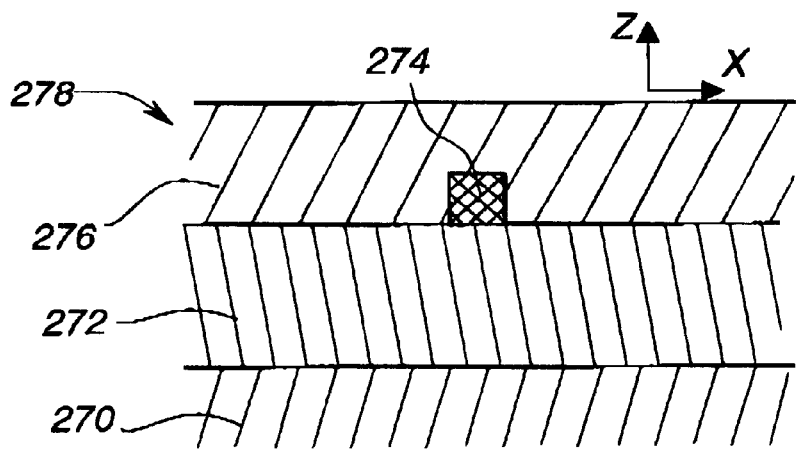
FIG. 7 shows three different core geometries and illustrates a method of compensating for form birefringence where present in each case.
Figure 7B:
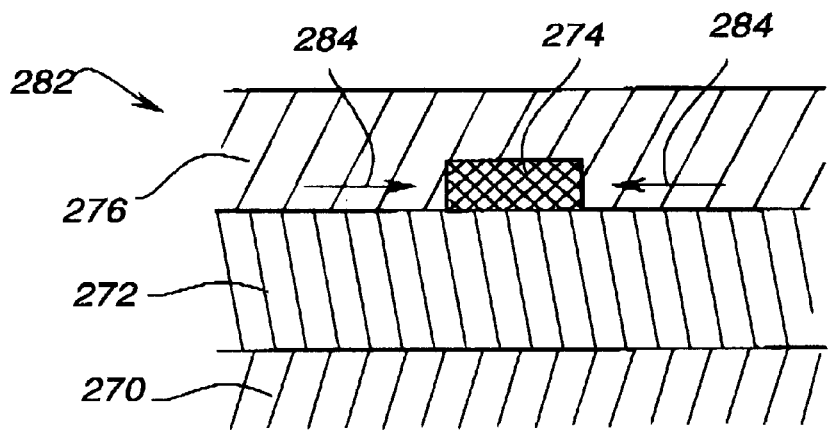
Figure 7C:
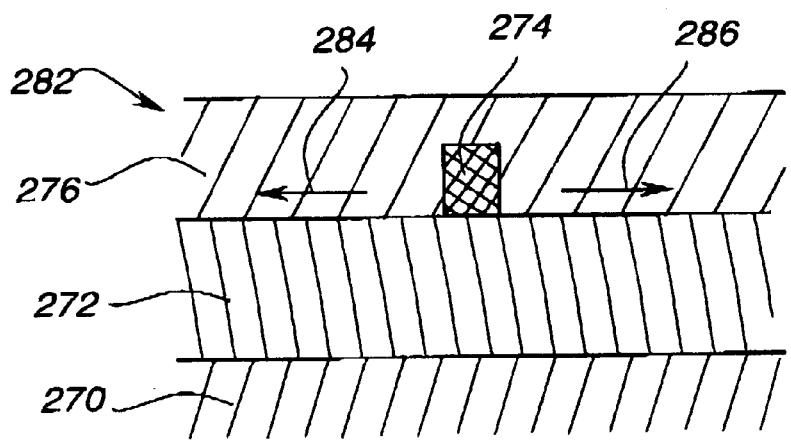
Figure 8:
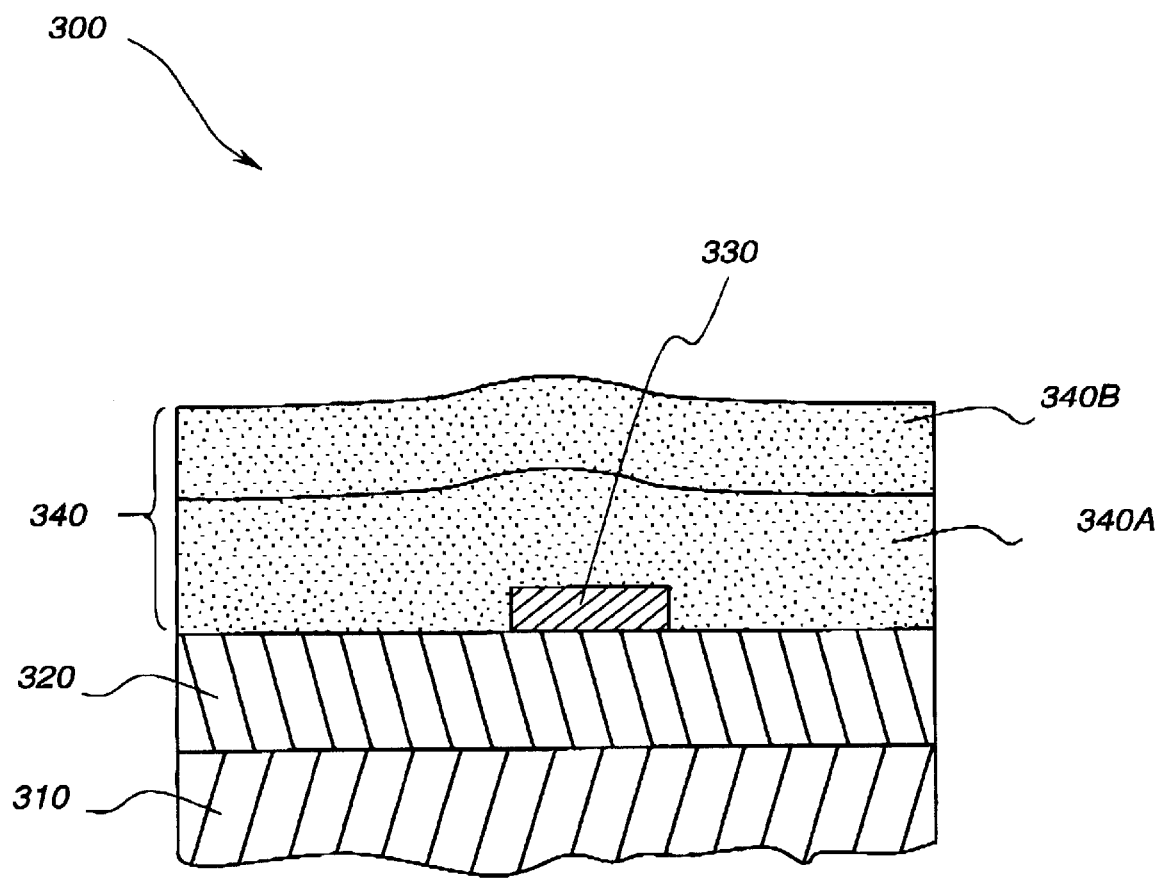
FIG. 8 shows a cross-sectional view of a waveguide fabricated in accordance with an alternative embodiment of the present invention.

FIGS. 7A–C show three different examples of channel waveguide geometries in order to illustrate the way in which the cladding layer can compensate for form birefringence. Each of FIGS. 7A–C show a waveguide comprising a substrate 270, a buffer layer 272, a core 274, and a cladding layer 276. In the waveguide 278 shown in FIG. 7A, the width of the core (i.e. dimensions in the x-direction transverse to the core direction, parallel to the substrate) is equal to the height of the core (i.e. dimensions in the z-direction perpendicular to the substrate). Such a core geometry does not impose any form birefringence on an optical signal as it propagates along the core, so it is desirable that the cladding layer 276 does not apply any net stress to the core 274.

In contrast, the waveguide 280 shown in FIG. 7B has a core 274 with a width which is greater than its height. The cross-section of this core results in a form birefringence which can be compensated for by inducing a biaxial compressive stress in the core parallel to the plane of the substrate. The compressive stress required to compensate for the core birefringence is be generated by the cladding layer 276. When the cladding layer is deposited on a silica substrate, thermal stresses will be compressive as silica has a coefficient of thermal expansion which is less than that of silicon. Thus, a compressive stress (as indicated by arrows 284) can be induced in the core 274 by depositing the cladding layer with a thermal stress and/or a compressive intrinsic stress.

Turning to FIG. 7C, a core 274 is shown in which its height is greater than its width. The form birefringence which results from this core geometry can be compensated for by inducing a biaxial tensile stress in the core parallel to the substrate, as indicated by arrows 286. The tensile stress can be induced in the core by depositing the cladding layer under conditions which form an intrinsic tensile stress in the cladding layer.

In each of the above examples, the required level of ion bombardment and deposition rate will, of course, depend on the level of thermal stress produced by the PECVD (which will depend on the deposition temperature) and on the level of form birefringence in the core 4. Intrinsic stress is also affected by the deposition rate (R) during the PECVD. Generally, intrinsic stress becomes more tensile as the deposition rate increases. Thus, the intrinsic stress of a film generally becomes more tensile as the ratio of R/E increases. For example, a compressive thermal stress can be counteracted by depositing a cladding layer using conditions in which the ratio of R/E is high. Conversely, a tensile thermal stress can be counteracted by depositing a cladding layer using deposition conditions in which the ratio R/E is relatively low.

The waveguide formed in accordance with this embodiment has the advantage that it does not require annealing. Annealing can have the undesirable effect of introducing thermal stress, thus making the waveguide polarisation sensitive.

The degree of ion bombardment at the upper surface 170 of the substrate can be controlled by adjusting one or more of the following:
1. a level of RF power applied across the electrodes 120, 130 by the lower frequency power supply 150;
2. a level of RF power applied across the electrodes 120, 130 by the higher frequency power supply 140;
3. an operating frequency of the lower frequency RF power supply 150; and
4. a total processing pressure in the chamber 110 during the PECVD.

The deposition rate at the upper surface 170 of the substrate can be controlled by adjusting one or more of the following:
1. the flow rate of vapour-phase precursor obtained from the first liquid-phase precursor (TEOS) 240;
2. the total processing pressure in the chamber 110 during the PECVD; and
3. the temperature of the substrate 160 during the PECVD.

A person skilled in the art will understand that the optimum values of the PECVD parameters will vary with each deposition system and will generally need to be selected through experimentation.

A second embodiment of a cladding-deposition method will now be described with reference to FIG. 7. As with the previous embodiment, a waveguide structure 300 comprises a silicon substrate 310 on which is deposited a silica buffer layer 320, a germanium-doped silica core 330, and a silica cladding layer 340. The core 330 and cladding 340 are deposited by PECVD. However, this embodiment differs from the previous embodiment in that the cladding layer 340 comprises a lower silica sub-layer 340A and an upper silica sub-layer 340B. Each sub-layer 340A, 340B applies approximately the same magnitude of stress to the waveguide, but the applied stresses are opposite in sign. Thus, the net stress applied to the waveguide is substantially zero. For example, when the lower sub-layer 340A applies a compressive stress to the underlying core and buffer layer, the upper sub-layer 340B applies a sufficient tensile stress to cancel out the compressive stress and prevent the waveguide from being polarisation sensitive. The sign of the stress in each sub-layer 340A, 340B can be controlled by controlling the deposition conditions as described above.

The cladding can also comprise more than two sub-layers. Again, the sub-layers can be deposited such that the net stress in the cladding is substantially eliminated. For example, the stresses in successive sub-layers can alternate between compressive and tensile stress. Alternatively, one or more sub-layers closest to the core can be deposited so that their net stress prevents polarisation sensitivity in the waveguide, and subsequent sub-layers can be deposited with a view to maximising the silica deposition rate. In this case, the one or more sub-layers closest to the core are believed to "shield" the core from the stresses in subsequent sub-layers to an extent sufficient to prevent polarisation sensitivity.

In a third embodiment of a cladding-deposition method, the cladding layer is deliberately deposited with a density which is lower than bulk density for silica, and then annealed. The annealing has the effect of increasing the density of the cladding layer, which in turn has the effect of at least partially counteracting any compressive thermal stresses in the cladding. The annealing temperature required to densify the cladding layer is substantially lower than its reflow temperature. An example of suitable annealing conditions is an annealing temperature of 700° C. in air or a nitrogen atmosphere for about 2 hours. The third embodiment is particularly advantageous when it is necessary to anneal the waveguide for reasons other than for removing polarisation sensitivity, such as when the waveguide is monolithically integrated with another optical component which requires annealing. Furthermore, the annealing step can allow the cladding to be deposited with a very high deposition rate.

It will be understood that the PECVD process described above can also be used to deposit silica-based layers on other substrates, such as non-silica or non-silicon materials, thereby enabling silica-based devices to be integrated with other devices. Although the core and buffer layer in each of the above-described embodiments comprise silica-based materials, the present invention is not limited to such materials. For example, the core may comprise a metal-oxide-based material. In one embodiment, the core comprises erbium-doped aluminium oxide. Also, the buffer layer, core layer and cladding layer can be formed on substrates other than silicon. It will be understood that any one of the waveguide structures described herein can incorporate other layers or structures which can be either silica-based or a non-silica materials. The expression "waveguide structure" is therefore intended to encompass any planar structure which at least includes a silica-based cladding layer, a core and a buffer layer and is arranged to guide electromagnetic radiation. Examples of planar waveguide structures included within the scope of the scope of the present invention are: amplifiers; lasers; Bragg gratings; multiplexers; demultiplexers; modulators; and attenuators. However, the present invention is not limited to these examples of waveguide structures.

It will be appreciated by a person skilled in the art that numerous variations and/or modifications may be made to the present invention as shown in the specific embodiments without departing from the spirit or scope of the invention as broadly described. The present embodiments are therefore to be considered in all respects illustrative and not restrictive. For example, it would be appreciated that processes similar to the general processes described herein can be used to fabricate any integrated combination of polarisation-insensitive silica-based device. The processes described herein can also be used to manufacture optical components on their own, and therefore the present invention is not limited to the fabrication of integrated optical devices.

I claim:

1. A method of manufacturing a waveguide structure which is substantially polarisation-insensitive, the method comprising:
   (a) depositing a buffer layer on a substrate;
   (b) depositing a core layer on the buffer layer and etching the core layer so as to form a waveguide core; and
   (c) performing plasma-enhanced chemical vapor deposition (PECVD) in the absence of nitrogen or nitrogen-containing gases to deposit a silica-based cladding layer over the core and so complete the waveguide structure, the cladding layer being undoped with Germanium, Phosphorus or Boron, wherein the PECVD of the cladding layer is carried out in a manner which substantially prevents polarization sensitivity in the waveguide structure.

2. A method in accordance with claim 1, wherein the cladding layer is deposited in a manner which makes it unnecessary to subsequently anneal or reflow the cladding layer.

3. A method in accordance with claim 1, wherein the PECVD is carried out using deposition conditions selected such that any stresses induced by the cladding layer are distributed in a manner which substantially prevents polarisation sensitivity in the waveguide.

4. A method in accordance with claim 1, wherein the PECVD is carried out using deposition conditions selected to induce an intrinsic stress in the waveguide structure which at least partially negates any thermal stress in the waveguide so as to substantially prevent polarisation sensitivity in the waveguide.

5. A method in accordance with claim 1, wherein the PECVD is carried out using deposition conditions selected to induce a degree of stress in the core sufficient to substantially compensate for any form birefringence resulting from a geometry of the core.

6. A method in accordance with claim 1, wherein the PECVD is carried out using deposition conditions selected to provide a degree of ion bombardment and/or a deposition rate required to form the cladding layer in a manner which substantially prevents polarisation sensitivity in the waveguide structure.

7. A method in accordance with claim 6, wherein the required degree of ion bombardment is provided by controlling one or more of the following parameters:
   a frequency of RF power applied across electrodes used in the PECVD;
   a level of RF power applied across the electrodes; and
   a processing pressure during the PECVD.

8. A method in accordance with claim 6, wherein the PECVD is carried out using two RF power sources to apply RF power across electrodes used in the PECVD, wherein the two sources operate at different frequencies comprising a lower frequency and an upper frequency.

9. A method in accordance with claim 6, wherein the PECVD is carried out using two RF power sources operating at different frequencies to apply RF power across electrodes used in the PECVD, wherein the two RF power sources comprise a lower frequency power supply and an upper frequency power supply, and the required degree of ion bombardment is provided by controlling one or more of the following parameters:
   a level of RF power applied across the electrodes by the lower frequency power supply;
   a level of RF power applied across the electrodes by the upper frequency power supply;
   an operating frequency of the upper and/or lower frequency power supplies;
   a processing pressure used during the PECVD deposition.

10. A method in accordance with claim 6, wherein the required deposition rate is controlled by controlling one or more of the following deposition parameters:
    a flow rate of a vapour-phase precursor used in the PECVD;
    a process pressure during the PECVD; and
    a substrate temperature during the deposition.

11. A method in accordance with claim 1, wherein a vapour-phase precursor used in the PECVD to form the cladding layer is obtained from a liquid source of precursor material.

12. A method in accordance with claim 1, wherein the step of depositing the cladding layer further comprises introducing refractive-index-modifying dopants into the cladding layer to compensate for any refractive index differences between the cladding layer and the buffer layer.

13. A method in accordance with claim 1, wherein the step of depositing the cladding layer comprises depositing two or more sub-layers in which at least one sub-layer is deposited in a manner which substantially prevents polarisation sensitivity in the waveguide structure.

14. A method in accordance with claim 13 wherein the sub-layers are deposited such that at least one sub-layer is under a degree of tensile stress and at least one other sub-layer is under a degree of compressive stress, wherein the sub-layers are arranged such that the tensile and compressive stresses substantially cancel each other out.

15. A method of manufacturing a waveguide structure which is substantially polarisation-insensitive, the method comprising:
    (a) depositing a buffer layer on a substrate;
    (b) depositing a core layer on the buffer layer and etching the core layer so as to form a waveguide core; and
    (c) depositing a silica-based cladding layer over the core, the cladding layer being undoped with Germanium, Phosphorous or Boron and being formed by:
       (i) depositing an initial silica-based layer over the core by means of plasma-enhanced chemical vapour deposition (PECVD) in the absence of nitrogen or nitrogen-containing gases; and
       (ii) subsequently annealing the initial silica-based layer so as to form the cladding layer, wherein the annealing and the PECVD are carried in a manner which substantially prevents polarisation sensitivity in the waveguide structure, and the annealing is carried out at a temperature which is higher than a deposition temperature during the PECVD but sufficiently low to substantially avoid reflowing of the initial silica-based layer.

16. A method in accordance with claim 15, wherein the PECVD and annealing are carried out under conditions selected such that any stresses induced by the cladding layer are distributed in a manner which substantially prevents polarisation sensitivity in the waveguide.

17. A method in accordance with claim 15, wherein the PECVD and annealing are carried out using conditions selected such that the cladding layer induces a degree of stress in the core sufficient to compensate for any form birefringence resulting from the geometry of the core.

18. A method in accordance with claim 15, wherein the PECVD is carried out using two RF power sources to apply RF power across electrodes used in the PECVD, wherein the two sources operate at different frequencies comprising a lower frequency and an upper frequency.

19. A method in accordance with claim 15, wherein a vapour-phase precursor used in the PECVD to form the cladding layer is obtained from a liquid source of precursor.

20. A method in accordance with claim 15, wherein the step of depositing the cladding layer further comprises introducing refractive-index-modifying dopants into the cladding layer to compensate for any refractive index differences between the cladding layer and the buffer layer.

21. A method in accordance with claim 15, wherein the PECVD and annealing are carried out using conditions selected such that the initial silica-based layer has an initial density which increases during the annealing, wherein the increase in density is sufficient to at least partly counteract any stress in the initial silica-based layer.

22. A method in accordance with claim 21 wherein the magnitude of stress which is counteracted during the annealing is of a sufficient magnitude to substantially prevent polarisation sensitivity in the waveguide structure.

23. A method in accordance with claim 21, wherein the selected PECVD conditions provide a degree of ion bombardment and/or a deposition rate required to give rise to the initial density in the initial silica-based layer.

24. A method in accordance with claim 21, wherein the selected PECVD conditions provide a degree of ion bombardment and/or a deposition rate required to give rise to the initial density in the initial silica-based layer, the required degree of ion bombardment being provided by controlling one or more of the following parameters:

a frequency of RF power applied across electrodes used in the PECVD;

a level of RF power applied across the electrodes; and a processing pressure during the PECVD.

25. A method in accordance with claim 21, wherein the selected PECVD conditions provide a degree of ion bombardment and/or a deposition rate required to give rise to the initial density in the initial silica-based layer, and wherein the PECVD is carried out using two RF power sources operating at different frequencies, the two RF power sources comprising a lower frequency power supply and an upper frequency power supply, and the required degree of ion bombardment being provided by controlling one or more of the following parameters:

a level of RF power applied across the electrodes by the lower frequency power supply;

a level of RF power applied across the electrodes by the upper frequency power supply;

an operating frequency of the upper and/or lower frequency power supplies;

a processing pressure used during the PECVD deposition.

26. A method in accordance with claim 21, wherein the selected PECVD conditions provide a degree of ion bombardment and/or a deposition rate required to give rise to the initial density in the initial silica-based layer, and wherein the required deposition rate is controlled by controlling one or more of the following deposition parameters:

a flow rate of a vapour-phase precursor used in the PECVD;

a process pressure during the PECVD; and a substrate temperature during the deposition.

* * * * *